United States Patent
Nakamura

(10) Patent No.: US 9,558,972 B2
(45) Date of Patent: Jan. 31, 2017

(54) LIQUID TREATMENT APPARATUS INCLUDING RETURN PATH AND SWITCHING MECHANISM

(71) Applicant: TOKYO ELECTRON LIMITED, Tokyo (JP)

(72) Inventor: Tooru Nakamura, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 420 days.

(21) Appl. No.: 14/289,992

(22) Filed: May 29, 2014

(65) Prior Publication Data

US 2014/0352741 A1    Dec. 4, 2014

(30) Foreign Application Priority Data

May 31, 2013  (JP) .................................. 2013-116043

(51) Int. Cl.
*H01L 21/67*    (2006.01)

(52) U.S. Cl.
CPC ... *H01L 21/67051* (2013.01); *H01L 21/67017* (2013.01)

(58) Field of Classification Search
None
See application file for complete search history.

(56) References Cited

U.S. PATENT DOCUMENTS

| 8,043,469 B2 * | 10/2011 | Nakamori | ......... | H01L 21/02019 |
| | | | | 156/345.21 |
| 8,394,156 B2 * | 3/2013 | Chuang | ............. | H01L 21/67017 |
| | | | | 454/187 |

FOREIGN PATENT DOCUMENTS

| JP | 2004-327768 | 11/2004 |
| JP | 2007-263485 | 10/2007 |

* cited by examiner

*Primary Examiner* — Michael Barr
*Assistant Examiner* — Rita Adhlakha
(74) *Attorney, Agent, or Firm* — Burr & Brown, PLLC

(57) ABSTRACT

In one embodiment, a clean gas supply mechanism includes a supply path having an upstream end provided with a gas intake port, and a downstream end connected to a treatment chamber. The supply path is provided therein with a fan, and a filter disposed upstream of the fan. A return path branches from the supply path at a first position downstream of the fan and upstream of the treatment chamber and is connected to the supply path at a second position downstream of the filter and upstream of the fan. A switching mechanism selectively switches between a first state where the clean gas flows into the treatment chamber, and a second state where the clean gas returns to the supply path through the return path.

12 Claims, 2 Drawing Sheets

LIQUID TREATMENT APPARATUS INCLUDING RETURN PATH AND SWITCHING MECHANISM

CROSS-REFERENCE TO RELATED APPLICATION

The present application is based on and claims a benefit of priority from Japanese Patent Application No. 2013-116043 filed on May 31, 2013, the entire contents of which are incorporated herein by reference.

TECHNICAL FIELD

The present invention relates to a liquid treatment apparatus that processes a treatment object with a liquid treatment in the treatment chamber while supplying a clean gas into the treatment chamber.

BACKGROUND ART

In semiconductor device fabricating processes, semiconductor wafers (hereinafter referred to simply as "wafers") are subjected to a cleaning treatment using, for example, a chemical liquid and a rinsing liquid. The cleaning treatment typically includes, for example, a chemical liquid treatment step, a deionized water (DIW) rinsing step, and a drying step performed in this order. Prior to, or in the beginnings of, the drying step, DIW on the wafer is substituted by isopropyl alcohol (IPA). To prevent generation of watermarks, humidity in the treatment chamber is reduced before performing the drying step. To create a low-humidity environment in the treatment chamber, low-humidity high-cleanliness air called clean dry air (CDA) is supplied into the treatment chamber (see JP2007263485A).

Producing the CDA (hereinafter referred to as "dry air") costs high. Thus, in the chemical liquid treatment step and the rinsing step in which the low-humidity environment is not required, clean air is supplied into the treatment chamber using a fan filter unit (FFU) disposed on a ceiling of the treatment chamber. Only in the drying step that requires the low-humidity environment, the dry air is supplied into the treatment chamber.

As is well known, the FFU draws air from outside the treatment chamber (air in a clean room) to form an airflow by using a fan, and filters the air by a filter provided in an airflow path to produce clean air.

If the FFU fan is stopped while the dry air is being supplied, it takes a long time for the flow of the clean air supplied from the FFU to be steadily formed in the treatment chamber, after the fan is restarted. From this viewpoint, preferably, the FFU fan is not stopped. As described in JP2007263485A, however, while the dry air is being supplied to the treatment chamber, the clean air having humidity higher than that of dry air should not be supplied into the treatment chamber. Therefore, if the FFU fan is always kept operated, a blocking damper disposed in the FFU airflow path is closed. In order to prevent increase of the internal pressure in the airflow path upstream of the blocking damper at this time, air in the airflow path is discarded from an air vent opening disposed upstream of the fan. If the filter is disposed upstream of the fan, fresh air always flows through the filter, which shortens a service life of the filter.

SUMMARY

In one embodiment, the present invention provides a clean gas supply mechanism capable of extending a service life of a filter disposed upstream of a fan even if the fan is always kept operated.

In one embodiment, the present invention provides a liquid treatment apparatus, which includes: a treatment chamber in which liquid treatment is performed to a treatment object; and a clean gas supply mechanism that supplies the treatment chamber with a clean gas. The clean gas supply mechanism includes: a supply path having an upstream end provided with a gas intake port and a downstream end connected to the treatment chamber; a fan disposed in the supply path to form in the supply path a flow of the clean gas flowing from the gas intake port toward the treatment chamber; a filter disposed upstream of the fan in the supply path; a return path that branches from the supply path at a first position downstream of the fan and upstream of the treatment chamber, and that is connected to the supply path at a second position downstream of the filter and upstream of the fan; and a switching mechanism that selectively switches between a first state where the switching mechanism causes the clean gas flowing downstream from the fan to flow into the treatment chamber, and a second state where the switching mechanism causes the clean gas flowing downstream from the fan to return to the supply path through the return path.

According to the above embodiment, when the fan is being operated, the clean gas flowing downstream from the fan returns to the supply path through the return path to circulate the clean gas. Thus, the flow rate of the clean gas passing through the filter can be reduced to zero or a very small value, so that the service life of the filter can be extended.

BRIEF DESCRIPTION OF DRAWINGS

The present invention will be described hereinafter with reference to the accompanying drawings.

DESCRIPTION OF EMBODIMENTS OF THE INVENTION

An embodiment of the present invention will be described below with reference to the accompanying drawings.

Figure 1:
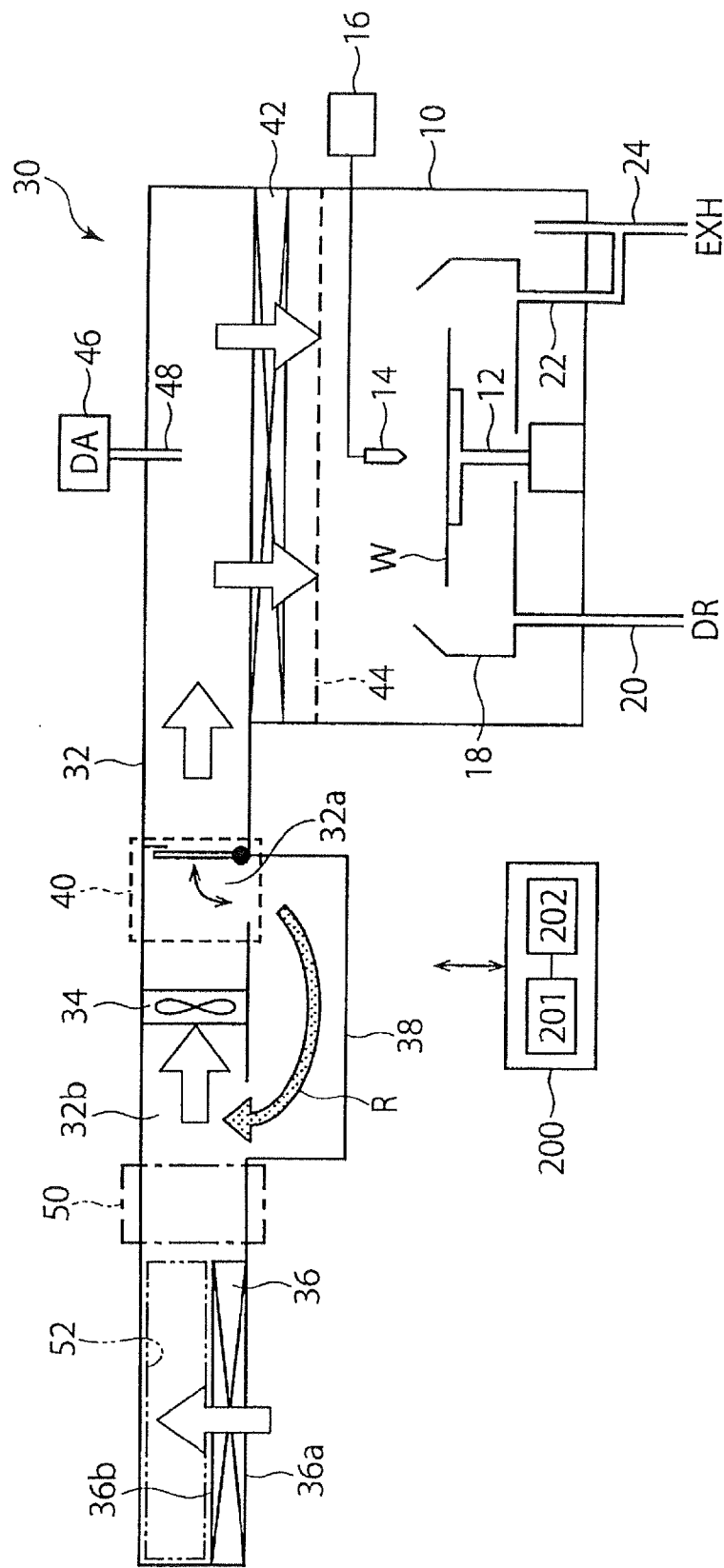
FIG. 1 is a schematic cross-sectional view showing a configuration of a liquid treatment apparatus in one embodiment of the present invention.

As shown in FIG. 1, a liquid treatment apparatus includes a treatment chamber 10, in which a predetermined set of liquid treatment is performed to a substrate W such as a semiconductor wafer as a treatment object using a treatment liquid. The treatment chamber 10 is provided therein with a spin chuck 12, which is a substrate holding structure that rotates the substrate W about a vertical axis, while holding the substrate W in a horizontal posture.

The treatment chamber 10 houses therein a nozzle 14 that supplies the substrate W held by the spin chuck 12 with a treatment fluid. The treatment fluid is supplied from a treatment fluid supply source to the nozzle 14 via a treatment fluid supply control mechanism 16 that includes a flow control valve, a shutoff valve and so on.

A liquid receiving cup 18 is disposed to surround the substrate W held by the spin chuck 12. A drainage path 20 and an exhaust path 22 are connected to a bottom portion of the liquid receiving cup 18. An exhaust path 24 is connected to a bottom portion of the treatment chamber 10. The drainage path 20 is connected to a factory waste liquid drainage system, not shown. The exhaust paths 22 and 24 are connected to an exhaust duct (not shown) having an interior of a negative pressure that forms part of a factory exhaust system.

It is noted that, in practical applications, one or more nozzles 14 and treatment fluid supply control mechanisms 16 are provided corresponding in number to the number of the types of the treatment fluids required for a series of treatment steps performed to the substrate; a plurality of flow paths corresponding to the number of the types of treatment fluid are formed in the liquid receiving cup 18 by changing the positions of movable cup members (not shown); and a plurality of drainage paths 20 and exhaust paths 22 and 24 corresponding in number to the number of flow paths are formed. Such a configuration is well known in the art and illustrations and detailed descriptions therefor are omitted.

A configuration of a clean gas supply mechanism 30 will be described in detail below.

The clean gas supply mechanism 30 includes a supply duct 32 that serves as a supply path, through which air drawn in from a space in a clean room flows toward the treatment chamber 10. A fan 34 is disposed in the supply duct 32.

A chemical filter 36 is disposed at a position upstream of the fan 34 in the supply duct 32 (in the illustrated embodiment, a portion of an air (gas) intake port at the upstream end portion of the supply duct 32). The chemical filter 36, as a first filter, adsorbs and removes molecular contaminants, e.g., an ammonia component. The chemical filter 36 can purify air by adsorbing to remove chemical substances such as acid, alkali, and organic matter that cannot be trapped by a ULPA filter or the like that purifies air by filtering particulate matter contained in the air. For example, if air drawn into the supply duct 32 contains an ammonia component, a product derived from ammonia is produced on the substrate W, causing a particle. Such an ammonia component can be removed by the chemical filter 36.

At a first position 32a of the supply duct 32 downstream of the fan 34 and upstream of the treatment chamber 10, a return duct 38 as a return path branches from the supply duct 32. The return duct 38 is connected to the supply duct 32 at a second position 32b of the supply duct 32 downstream of the chemical filter 36 and upstream of the fan 34. A switching damper 40 is disposed at the first position 32a of the supply duct 32. The switching damper 40 functions as a switching mechanism that selectively takes a first state where the switching damper 40 causes air that has flowed to the first position 32a to flow directly toward the treatment chamber 10, and a second state (the position shown in FIG. 1) where the switching damper 40 causes air that has flowed to the first position 32a to flow toward the return duct 38.

The supply duct 32 has a downstream end connected to a ceiling opening in the treatment chamber 10. A ULPA filter 42 as a second filter that filters airborne particulate matter is disposed in the ceiling opening. A baffle plate 44 having a large number of openings is disposed below the ULPA filter 42 in the treatment chamber 10.

The clean gas supply mechanism 30 further includes a low humidity gas supply unit 46 that supplies into the treatment chamber 10: a gas (e.g., dry air) having humidity lower than that of air drawn in from the space in the clean room via the chemical filter 36; or a gas (e.g., nitrogen gas) having humidity and oxygen concentration both lower than those of the air drawn in from the space in the clean room through the chemical filter 36. In the illustrated embodiment, the low humidity gas supply unit 46 includes a gas nozzle 48 that discharges low humidity gas into the supply duct 32. The gas nozzle 48 may be disposed such that: the low humidity gas is discharged to a space between the ULPA filter 42 and the baffle plate 44; or such that the low humidity gas is discharged into a space in the treatment chamber 10 below the baffle plate 44.

The liquid treatment apparatus includes a controller 200 that generally controls operations of the liquid treatment apparatus. The controller 200 controls operations of all functional components of the liquid treatment apparatus (e.g., the spin chuck 12, the treatment fluid supply control mechanism 16, and the clean gas supply mechanism 30). The controller 200 may be achieved by, for example, a (general-purpose) computer as hardware and, as software, programs (including a system control program and treatment recipes) for causing the computer to operate. The software is stored in a storage medium fixedly disposed in the computer such as a hard disk drive or one removably set in the computer such as a CD-ROM, a DVD, and a flash memory. Such a storage medium is denoted by reference sign 201 in FIG. 1. A processor 202 calls a predetermined recipe from the storage medium 201, as needed basis, in accordance with, for example, instructions from a user interface not shown and causes the functional components to execute the recipe. This results in each of the functional components operating to perform the prescribed treatment under the control of the controller 200.

An exemplary set of treatment performed by the liquid treatment apparatus for the substrate W under the control of the controller 200 will be described below.

The substrate W is loaded by a substrate transfer arm not shown into the treatment chamber 10 and held by the spin chuck 12. Before the loading of the substrate W, a downflow of clean air is formed in the treatment chamber 10 by the clean gas supply mechanism 30. That is, the switching damper 40 is in the first state and the fan 34 is operating. Under this condition, air in the clean room is drawn into the supply duct 32 via the chemical filter 36 at the gas intake port of the supply duct 32 as indicated by the blank arrow in FIG. 1. The air (gas) is purified as the molecular contaminants are removed therefrom during its passage through the chemical filter 36. The purified air, i.e., clean gas flows downwardly through the supply duct 32 toward the treatment chamber 10 and past the ULPA filter 42. As the air flows past the ULPA filter 42, particles are removed from the air, so that the air is further purified. The air flowing from the ULPA filter 42 is blown into the treatment chamber 10 through the openings in the baffle plate 44, so that a downflow of the clean air is formed inside the treatment chamber 10.

The substrate W held in the spin chuck 12 rotates and the nozzle 14 for supplying diluted hydrofluoric acid (DHF) as a treatment liquid (chemical liquid) supplies the DHF to the center of the substrate W, thereby removing metal contaminants, a natural oxide film, and the like from the substrate W (Chemical Liquid Cleaning Step). At this time, part of the clean air downflow is drawn into the liquid receiving cup 18 and exhausted via the exhaust path 22. This airflow maintains a clean gas atmosphere in areas around the substrate W and prevents the treatment fluid (in this case, DHF) that has been supplied to, and splashed from, the substrate W from scattering in the treatment chamber 10. Another part of the clean air downflow flows toward a radially outer area of the liquid receiving cup 18 and is exhausted by way of the exhaust path 24. This airflow prevents a treatment fluid atmosphere from stagnating outside the liquid receiving cup 18.

While the substrate W continues rotating, the supply of the DHF to the substrate W is stopped and the nozzle 14 for supplying the deionized water (DIW) supplies the DIW as a treatment liquid (rinsing liquid) to the center of the substrate W. Thereby, the DHF and reaction products remaining on the substrate W are rinsed off from the surface of the substrate W (Rinsing Step).

Next, while the substrate W continues rotating, the supply of the DIW to the substrate W is stopped and the nozzle 14 for supplying the isopropyl alcohol (IPA) discharges the IPA as a treatment liquid (drying promoting liquid); thereafter, the position of supply of IPA from the nozzle onto the substrate W is gradually moved radially outward. Thereby, the IPA is substituted for the DIW on the substrate W (IPA Substituting Step).

The supply of the IPA to the substrate W is then stopped and, while the substrate W continues rotating, preferably, the rotation speed of the substrate W is increased, thereby to dry the substrate W (Drying Step).

At predetermined timing during a series of the foregoing steps, the clean gas supplied from the clean gas supply mechanism 30 into the treatment chamber 10 is changed from the clean air to the dry air. The "predetermined timing", as used herein, refers to a specific point of time ensuring that, for example, the atmosphere surrounding the substrate W becomes a low humidity air atmosphere before, at the latest, the IPA dries to expose at least part of a surface of the substrate W. Specifically, for example, the "predetermined timing" is at the last moment of the end of the rinsing step. It is noted that the foregoing switching may be performed at such timing that the atmosphere surrounding the substrate W becomes a low humidity air atmosphere at the start of the IPA substituting step.

At the switching of the clean gas, the switching damper 40 is placed in the second state with the fan 34 kept operating, and the supply of the dry air from the low humidity gas supply unit 46 is started. Thereby, a dry air downflow is formed in the treatment chamber 10. Similar to the clean air, the dry air flows through the treatment chamber 10 and the liquid receiving cup 18 before being discharged via the exhaust paths 22 and 24. The dry air costs high. In addition, in the IPA substituting step and the drying step, the area around the substrate W is relatively clean, and thus a need for removal of a contaminating atmosphere is low. Thus, the dry air is generally supplied to the treatment chamber 10 at a flow rate lower than that of the clean air. Additionally, the exhausting flow rate via the exhaust paths 22 and 24 is reduced through the adjustment of an opening degree of a flow control valve (e.g., a butterfly valve), not shown, according to the change in the flow rate of the clean gas.

Upon switching damper 40 into the second state, the air flowing through the supply duct 32 no longer flows downstream of the switching damper 40 in the supply duct 32, but returns through the return duct 38 to a position upstream of the fan 34 in the supply duct 32 (see an arrow R in FIG. 1). Specifically, the air circulates through a circulating path formed of a section of the supply duct 32 extending from the first position 32a to the second position 32b and the return duct 38. Due to the circulating airflow described above, substantially normal pressure is maintained in a section of the supply duct 32 upstream of the fan 34 and substantially no air flows into the supply duct 32 through the chemical filter 36. This extends the service life of the chemical filter 36 accordingly. In addition, since the foregoing circulating path is isolated from the outside, starting immediately after the switching damper 40 is switched from the second state to the first state, clean air that has undergone removal of molecular contaminants including the ammonia component by the chemical filter 36 can be supplied to the treatment chamber 10. The formation of the circulating airflow eliminates the likelihood that pressure near the first position 32a of the supply duct 32 will builds up excessively. As a result, leakage toward the downstream side is less likely to occur even with a simply structured switching damper 40. Thus, air with a humidity higher than that of the dry air can be prevented from leaking downstream from the switching damper 40 to be mixed with the dry air.

When the IPA on the substrate W evaporates to complete the drying step, the switching damper 40 is placed in the first state and the supply of the low humidity gas from the low humidity gas supply unit 46 is suspended. This again forms a clean air downflow in the treatment chamber 10. As described earlier, the fan 34 is made to continue operating while the low humidity gas is being supplied into the treatment chamber 10. This forms a steady circulating airflow and, as soon as the switching damper 40 is placed in the first state, air is sent downstream from the second position 32b of the supply duct 32. This allows a condition in which a clean air downflow is formed in the treatment chamber 10 to develop soon after the switching damper 40 is placed in the first state, so that the subsequent step (in this case, substrate W unloading and loading steps to be described below) can be started immediately. Under this condition, the substrate W is unloaded from the treatment chamber 10 by the substrate transfer arm not shown and another substrate W to be next treated is loaded in the treatment chamber 10 and held by the spin chuck 12. This completes a series of steps performed for a single substrate.

A three-dimensional arrangement suitable for elements disposed on a side near the chemical filter 36 of the clean gas supply mechanism 30 will be described below with reference to FIG. 2. In the following description, points denoted by reference signs that start with an identical alphabet are disposed on the same plane. In addition, in the following description, terms indicating geometric shapes such as a "rectangular parallelepiped" and a "rectangle" refer to not only the corresponding exact shapes (a "rectangular parallelepiped" and a "rectangle"), but also shapes substantially similar thereto.

The clean gas supply mechanism 30 includes a housing 30H shaped as a rectangular parallelepiped having points A1, A2, A3, A4, C1, C2, C3, and C4 as apices. The chemical filter 36 shaped as a rectangular parallelepiped having points A5, A2, A4, A6, B1, B2, B3, and B4 as apices is disposed inside the housing 30H. A rectangular plane having points A5, A2, A4, and A6 as apices constitutes an inlet surface (that corresponds to 36a in FIG. 1) of the chemical filter 36 that assumes the gas intake port. A wall surface of the housing 30H that faces the inlet surface of the chemical filter 36 is an opening. A rectangular plane having points B1, B2, B3, and B4 as apices constitutes an outlet surface (that corresponds to 36b in FIG. 1) of the chemical filter 36. Surfaces of the chemical filter 36 other than the inlet surface and the outlet surface are wall surfaces through which air cannot pass.

The fan 34 having a casing shaped as a rectangular parallelepiped having points A7, A8, A9, A6, C5, C6, C7, and C8 (C8 is invisible in FIG. 2 and reference numeral C8 is not indicated therein) as apices is disposed in the housing 30H of the clean gas supply mechanism 30. The casing of the fan 34 has a rectangular upper surface having points C5, C6, A7, and A8 as apices and the rectangular upper surface has a circular air intake port 34a formed therein. The casing of the fan 34 has a rectangular side surface having points C5, A7, C7, and A9 as apices and the rectangular side surface has a rectangular air blowout port 34b formed therein.

Surfaces of the casing of the fan 34 other than the above-mentioned two surfaces are all surfaces through which air cannot pass. A fan impeller 34c is disposed inside the casing of the fan 34. A multiblade fan impeller, a sirocco fan impeller, a turbo fan impeller, or the like is used as the fan impeller 34c and the fan 34 is formed as a radial flow fan. The fan impeller 34c rotates about a rotational axis extending in a Z direction in FIG. 2, thereby air is drawn into the casing of the fan 34 from the air intake port 34a. The air then flows radially outwardly from the fan impeller 34c and eventually blows through the air blowout port 34b in an X direction in FIG. 2 from the casing of the fan 34.

In general, a radial flow fan produces a relatively high wind pressure for the same flow rate as compared with fans of other types (e.g., an axial flow fan and a diagonal flow fan). Thus, the use of the radial flow fan for the fan 34 allows the airflow into the treatment chamber 10 to rise quickly when the switching damper 40 is switched from the second state to the first state. It is noted that, although the radial flow fan is preferably used as described above, a fan of any other type may still be used.

The switching damper 40 having a casing shaped as a rectangular parallelepiped having points C9, C10, C3, C11, A10, A11, A3, and A12 as apices is disposed in the housing 30H of the clean gas supply mechanism 30. The casing of the switching damper 40 has a rectangular upper surface having points C9, C10, A10, and A11 as apices and the rectangular upper surface is provided therein with a first opening 40a. The casing of the switching damper 40 has a rectangular side surface having points C9, A10, C3, and A3 as apices and the rectangular side surface is provided therein with a second opening 40b. The switching damper 40 includes a plate-shaped blade (not shown in FIG. 2) that rotates about a rotational axis substantially corresponding to a line segment connecting points C9 and A10. When the first opening 40a in the upper surface is closed by the blade not shown of the switching damper 40 (i.e., the first state of the switching damper 40), air passes through the opened second opening 40b to flow toward the treatment chamber 10. When the second opening 40b in the side surface is closed (i.e., the second state of the switching damper 40), air passes through the opened first opening 40a to be returned to a fan upstream space (a space of a rectangular parallelepiped having points C1, C9, A10, A1, C12, A5, A8, and C6 as apices) upstream of the fan 34. A rectangular partition plate having points C10, C5, A11, and A7 as apices is disposed in the housing 30H of the clean gas supply mechanism 30. The fan upstream space in the housing 30H disposed above the switching damper 40 and the fan 34 corresponds to the return duct 38 as the return path shown in FIG. 1. The fan upstream space communicates with a buffer space to be described later.

Figure 2:
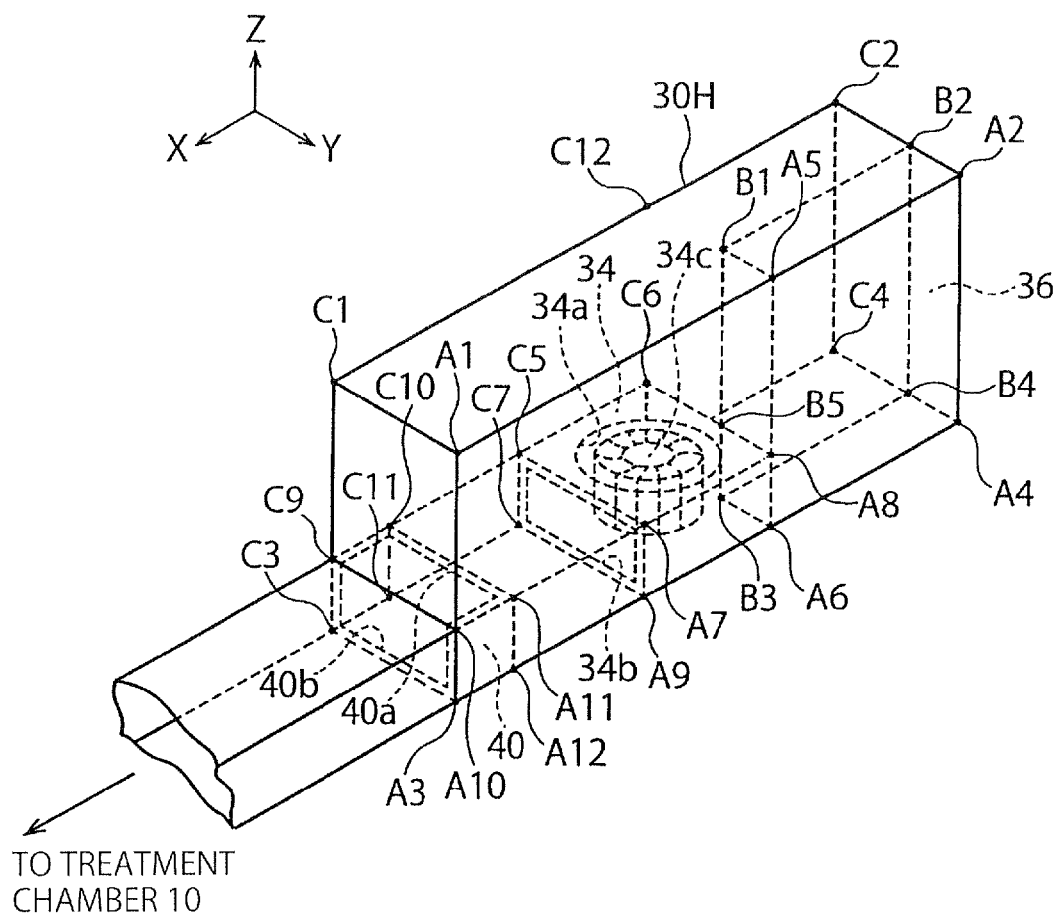
FIG. 2 is a perspective view showing an exemplary three-dimensional arrangement of elements of a clean gas supply mechanism.

In the arrangement shown in FIG. 2, when the fan 34 is operated with the second opening 40b in the side surface of the switching damper 40 closed, a circulating airflow is created in the housing 30H of the clean gas supply mechanism 30, the circulating airflow flowing out from the air blowout port 34b in the side surface of the fan 34, flowing past the first opening 40a in the switching damper 40 to flow into the air intake port 34a of the fan 34, and being redrawn into the fan 34 before flowing out from the air blowout port 34b.

Referring to FIG. 2, a buffer space (a space of a rectangular parallelepiped having points B1, B2, B3, B4, C12, C2, C4, and invisible C8 as apices) is disposed in the housing 30H. The buffer space has a shape of an approximate cylinder ("cylinder" as geometric term; in this case, a rectangular parallelepiped) having an outlet surface of the chemical filter 36 (the rectangular plane having points B1, B2, B3, and B4 as apices) as one bottom surface and a direction in which air discharged from the outlet surface of the chemical filter 36 flows as a height direction. As evident from FIG. 2, the buffer space receives clean gas discharged from the outlet of the filter and connected to a space downstream thereof (in the present embodiment, the fan upstream space) in a direction transverse to a direction in which the gas is discharged from the filter. The buffer space and the space downstream thereof (in the present embodiment, the fan upstream space) connected to each other only via a portion that corresponds to a side surface of the cylinder (in this example, of this side surface, a rectangular plane having points C12, B1, B5, and C6 as apices, not blocked by the fan 34).

Due to the provision of such a buffer space, even if small pressure fluctuation occurs on the downstream side of the buffer space, such pressure fluctuation is buffered by the buffer space, so that the chemical filter 36 is less likely to be affected by the pressure fluctuation. Even if the circulating airflow flows toward the chemical filter 36, the flow is buffered by the buffer space. Thus, even though the fan 34 is operated when the switching damper 40 is in the second state, the operation does not tend to cause a flow of air flowing in or out of the chemical filter 36 to occur. This feature is indicated also in FIG. 1, in which a buffer space enclosed by two-dot chain lines 52 is disposed in front of the outlet surface 36b of the chemical filter 36.

Reference is again made to FIG. 1. In order to more reliably prevent inflow of the circulating flow into the chemical filter 36 as discussed above, a blocking damper as an openable/closeable blocking mechanism may be disposed downstream of the chemical filter 36 and upstream of the second position 32b in the supply duct 32 (e.g., the position of a box 50 indicated by single-dot chain lines in FIG. 1). In this case, the blocking damper needs to be operated so as to be open when the switching damper 40 is in the first state, and closed when the switching damper 40 is in the second state. Switching of the blocking damper can also be performed under the control of the controller 200.

In constructing a substrate treatment system incorporating a plurality of foregoing liquid treatment apparatuses, due to the constraint related to the system layout, it may be that the distance of the path between the chemical filter 36 and the treatment chamber 10 in each liquid treatment apparatus cannot be set to be the same. In such a case, the distance of the path between the switching damper 40 and the treatment chamber may be set to be different among the liquid treatment apparatuses, while the arrangement of the switching damper 40 and the portion of the clean gas supply mechanism upstream of the switching damper 40 (in FIG. 2, the arrangement of a portion of the rectangular parallelepiped having points A1, A2, A3, A4, C1, C2, C3, and C4 as apices) are set to be the same among the liquid treatment apparatuses. If the arrangement of the switching damper 40 and the portion upstream thereof are the same among the liquid treatment apparatuses, the difference in the filter service life among the clean gas supply mechanisms of different liquid treatment apparatuses can be eliminated.

In the foregoing embodiment, the liquid treatment comprises a chemical liquid cleaning treatment including a chemical liquid cleaning step, and a DIW rising step and an IPA substituting step associated with the chemical liquid cleaning step. However, not limited thereto, the liquid treatment may comprise a chemical liquid cleaning treatment using another chemical liquid or an etching treatment.

The liquid treatment may still comprise a resist film forming treatment that applies a resist liquid to the substrate or a developing treatment that supplies a resist film after exposure with a developing liquid. The foregoing clean gas supply mechanism can supply a clean gas to any treatment chamber in which any of the foregoing various types of liquid treatments are performed.

In the foregoing embodiment, the gas supplied into the treatment chamber 10 when the switching damper 40 is in the second state is lower in humidity than the air drawn in from the space in the clean room through the chemical filter 36. However, not limited thereto, the gas may be of any type having nature different from that of the air drawn in via the chemical filter 36, and may be a gas other than a clean gas. The foregoing configuration is widely applicable to liquid treatment apparatuses that performs switching between a supply state in which air drawn in via the chemical filter 36 is supplied to the treatment chamber and a non-supply state in which the air is not supplied, where there is a need for quick start-up of the gas supply upon switching from the non-supply state to the supply state.

What is claimed is:

1. A liquid treatment apparatus comprising:
   a treatment chamber in which liquid treatment is performed to a treatment object; and
   a clean gas supply mechanism that supplies the treatment chamber with a clean gas,
   wherein the clean gas supply mechanism includes:
   a supply path having an upstream end provided with a gas intake port and a downstream end connected to the treatment chamber;
   a fan disposed in the supply path to form in the supply path a flow of the clean gas flowing from the gas intake port toward the treatment chamber;
   a filter disposed upstream of the fan in the supply path;
   a return path that branches from the supply path at a first position downstream of the fan and upstream of the treatment chamber, and that is connected to the supply path at a second position downstream of the filter and upstream of the fan; and
   a switching mechanism that selectively switches between a first state where the switching mechanism causes the clean gas flowing downstream from the fan to flow into the treatment chamber, and a second state where the switching mechanism causes the clean gas flowing downstream from the fan to return to the supply path through the return path.

2. The liquid treatment apparatus according to claim 1, wherein the filter comprises a chemical filter that removes molecular contaminants.

3. The liquid treatment apparatus according to claim 1, wherein the supply path provided therein with a buffer space connected to an outlet of the filter to receive the clean gas flowing out of the outlet of the filter, and wherein the buffer space is connected to a space downstream of the buffer space in a direction transverse to a direction in which the clean gas flows out of the outlet of the filter.

4. The liquid treatment apparatus according to claim 3, the clean gas supply mechanism includes a housing that includes the filter, the buffer space, the fan, and the switching mechanism.

5. The liquid treatment apparatus according to claim 4, wherein the housing further includes the return path that returns the clean gas from the switching mechanism to the fan.

6. The liquid treatment apparatus according to claim 5, wherein the return path is disposed above an air intake port of the fan.

7. The liquid treatment apparatus according to claim 5, wherein the return path connected to the buffer space.

8. The liquid treatment apparatus according to claim 6, wherein the fan comprises a radial flow fan.

9. The liquid treatment apparatus according to claim 1, further comprising a blocking mechanism, capable of opening and closing, disposed downstream of the filter and upstream of the second position to prevent the clean gas flowing through the return path from flowing toward the filter.

10. The liquid treatment apparatus according to claim 1, further comprising a gas supply unit that supplies the treatment chamber with a gas different from the clean gas when the switching mechanism is in the second state.

11. The liquid treatment apparatus according to claim 10, wherein the fan operates when the switching mechanism is in the second state.

12. The liquid treatment apparatus according to claim 1, wherein the fan comprises a radial flow fan.

* * * * *